US009120299B2

(12) United States Patent
Hauck et al.

(10) Patent No.: US 9,120,299 B2
(45) **Date of Patent: *Sep. 1, 2015**

(54) ALUMINUM SUBSTRATES AND LITHOGRAPHIC PRINTING PLATE PRECURSORS

(71) Applicant: Eastman Kodak Company, Rochester, NY (US)

(72) Inventors: Gerhard Hauck, Badenhausen (DE); Celin Savariar-Hauck, Badenhausen (DE); Oliver Richard Blum, Eddigehausen-Bovenden (DE); Michael Nielinger, Bonn (DE)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/062,940

(22) Filed: Oct. 25, 2013

(65) Prior Publication Data

US 2014/0047993 A1 Feb. 20, 2014

Related U.S. Application Data

(63) Continuation of application No. 13/089,399, filed on Apr. 19, 2011, now Pat. No. 8,632,940.

(51) Int. Cl.

| | |
|---|---|
| ***G03F 7/00*** | (2006.01) |
| ***B41C 1/10*** | (2006.01) |
| ***B41N 3/03*** | (2006.01) |

(52) U.S. Cl.

CPC ............. *B41C 1/1016* (2013.01); *B41C 1/1008* (2013.01); *B41N 3/036* (2013.01); *B41C 2201/02* (2013.01); *B41C 2201/14* (2013.01); *B41C 2210/02* (2013.01); *B41C 2210/04* (2013.01); *B41C 2210/06* (2013.01); *B41C 2210/10* (2013.01); *B41C 2210/12* (2013.01); *B41C 2210/14* (2013.01); *B41C 2210/24* (2013.01); *B41C 2210/262* (2013.01)

(58) Field of Classification Search

CPC .................................................... B41C 1/1016
USPC .......... 430/270.1, 302; 101/450.1, 453, 463.1
See application file for complete search history.

(56) References Cited

U.S. PATENT DOCUMENTS

| | | | | |
|---|---|---|---|---|
| 4,153,461 | A | 5/1979 | Berghäuser et al. | |
| 4,427,765 | A * | 1/1984 | Mohr et al. | 430/525 |
| 5,076,899 | A | 12/1991 | Sakaki et al. | |
| 5,314,787 | A | 5/1994 | Elsaesser et al. | |
| 5,368,974 | A | 11/1994 | Walls et al. | |
| 5,518,589 | A | 5/1996 | Matsuura et al. | |
| 6,114,089 | A | 9/2000 | Takita et al. | |
| 6,218,075 | B1 | 4/2001 | Kimura et al. | |
| 6,451,505 | B1 | 9/2002 | Patel et al. | |
| 7,049,048 | B2 | 5/2006 | Hunter et al. | |
| 2007/0128546 | A1 | 6/2007 | Saraiya et al. | |
| 2007/0172765 | A1 | 7/2007 | Teng | |
| 2008/0305435 | A1 | 12/2008 | Miyamoto | |
| 2009/0022961 | A1 | 1/2009 | Strehmel et al. | |
| 2010/0227269 | A1* | 9/2010 | Simpson et al. | 430/270.1 |
| 2011/0223540 | A1 | 9/2011 | Savariar-Hauck et al. | |

FOREIGN PATENT DOCUMENTS

| | | | |
|---|---|---|---|
| EP | 1 000 768 | 5/2000 | |
| EP | 1 974 912 | 10/2008 | |
| WO | 2005/010613 | 2/2005 | |
| WO | WO 2005010613 A1 * | 2/2005 | G03F 7/00 |
| WO | 2006/021446 | 3/2006 | |
| WO | 2006/028440 | 3/2006 | |
| WO | 2010/063763 | 6/2010 | |

* cited by examiner

*Primary Examiner* — Chanceity Robinson
(74) *Attorney, Agent, or Firm* — J. Lanny Tucker

(57) ABSTRACT

Electrochemically grained and anodized aluminum supports are treated with a post-treatment coating solution containing a polymer derived at least in part from vinyl phosphonic acid and phosphoric acid. This post-treated support is useful as substrates in the preparation of lithographic printing plate precursors. The post-treatment substrate treatment enables wide latitude in manufacturing and compatibility with silicate-free developers to achieve negligible background staining and oxide attack.

10 Claims, No Drawings

ALUMINUM SUBSTRATES AND LITHOGRAPHIC PRINTING PLATE PRECURSORS

RELATED APPLICATION

This is a Continuation application of copending and commonly assigned U.S. Ser. No. 13/089,399, filed Apr. 19, 2011 now issued as U.S. Pat. No. 8,632,940.

FIELD OF THE INVENTION

This invention relates to post-treated aluminum substrates and to positive-working lithographic printing plate precursors that can be prepared using such substrates. This invention also relates to a method of preparing these post-treated aluminum substrates and a method for preparing the precursors from the post-treated aluminum substrates.

BACKGROUND OF THE INVENTION

In conventional "wet" lithographic printing, ink receptive regions, known as imaged regions, are generated on a hydrophilic surface. When this surface is moistened with water and ink is also applied, the hydrophilic regions retain the water and repel the ink, and the ink receptive regions accept the ink and repel the water. The ink can be transferred to the surface of a material upon which the image is to be reproduced. For example, the ink can be first transferred to an intermediate blanket (roller) that in turn is used to transfer the ink and reproduce the image on the surface of receivers such as paper sheets, fabrics, metals, and films.

Imageable elements useful to prepare lithographic printing plates typically comprise one or more imageable layers applied over the hydrophilic surface of a substrate. Each imageable layer comprises the radiation-sensitive components dispersed in a polymeric binder that can respond to suitable imaging radiation. Following imaging, either the imaged regions or the non-imaged regions of the imageable layer(s) are removed by a suitable developer or processing solution, revealing the underlying hydrophilic surface of the substrate. If the imaged regions are removed, the element is considered as positive-working, and conversely if the non-imaged regions are removed, the element is considered as negative-working. In each instance, the regions of the imageable layer(s) that remain are ink-receptive and the regions of the hydrophilic surface revealed by development accept water and aqueous fountain solutions, and repel ink.

Such elements that are used to prepare lithographic printing plates are generally known as lithographic printing plate precursors.

In most instances, the substrate for these lithographic printing plate precursors has been an aluminum-containing support, the surface of which is generally roughened by surface graining in order to ensure good adhesion to overlying layer(s) and to improve water retention in non-imaged regions during lithographic printing. Various aluminum-containing substrates and methods for preparing them are described for example in U.S. Pat. No. 5,076,899 (Sakaki et al.) and U.S. Pat. No. 5,518,589 (Matsura et al.). To prepare aluminum-containing substrates for lithographic printing plate precursors, a continuous web of raw aluminum can be treated in a sequence of steps that are illustrated schematically in FIG. 1 of U.S. Patent Application Publication 2008/0305435 (Miyamoto) that is incorporated herein by reference. Oils are removed from the web or raw aluminum, followed by alkali etching, rinsing, graining (mechanical, electrochemical, or both), rinsing, post-graining acidic or alkali etching, rinsing, anodizing, rinsing, post-treatment, rinsing, and drying.

During anodization, the aluminum web is treated to form an aluminum oxide layer on its surface so that it will exhibit a high degree of resistance to mechanical abrasion during lithographic printing. This aluminum oxide layer is hydrophilic to some degree, but it is so reactive that it can interact with the components of the imageable layer(s) applied thereupon. The aluminum oxide layer can partially or completely cover the aluminum surface.

In the post-treatment step, the aluminum oxide layer is generally covered with a hydrophilic protective layer (also known in the art as a "seal", "interlayer", or "post-treatment") to increase substrate hydrophilicity before one or more imageable layer formulations are applied. The hydrophilic post-treatment layer can be applied by immersing the web in a post-treatment coating solution or by spraying such solution onto the web using a suitable spraying and recovery system. It is desirable that the hydrophilic post-treatment layer protects the aluminum oxide layer against corrosion during development with highly alkaline developers and from dye penetration from the imageable layer(s), otherwise known as "background staining".

U.S. Pat. No. 3,895,970 (Blum et al.) describes a phosphate/fluoride sealing process for treating metals including aluminum. In addition, EP 1,516,724 (Callant et al.) describes a process for sealing aluminum supports with phosphate/fluoride solutions to provide on-press developable lithographic printing plate precursors.

A variety of substances have been designed for use as hydrophilic post-treatment layers. Generally, such substances are polymers having carboxy, sulfonic acid, phosphonic acid, mercapto, hydroxyl, or amine functional groups. Phosphono-substituted siloxane hydrophilic protective layers are described in WO 2006/021446 (Fiebag et al.), vinyl copolymers are described for such layers in U.S. Pat. No. 7,049,048 (Hunter et al.), and copolymers having polyalkylene oxide side chains are described in WO 06/028440 (Strehmel et al.).

Other hydrophilic post-treatment layers are prepared from formulations including poly(vinyl phosphonic acid) (PVPA), vinyl phosphonic acid/acrylic acid (PVA/AA) copolymers, and poly(acrylic acid) (PAA) as described for example in U.S. Pat. No. 4,153,461 (Berghauser et al.) and U.S. Pat. No. 6,218,075 (Kimura et al.) and EP 0 537633A (Elsaesser et al). U.S. Pat. No. 4,427,765 (Mohr et al.) describes the use of a water-soluble polymer having acidic functional groups (phosphorous or sulfonic acid groups) with a salt of a divalent metal cation. U.S. Pat. No. 5,314,787 (Elsaesser et al.) describes post-treatment of aluminum substrates with a hydrophilic polymer solution followed by treatment with a solution containing divalent or polyvalent metal cations.

U.S. Patent Application Publication 2008/0305435 (noted above) describes a method for preparing aluminum substrates that includes treating the aluminum support with a post-treatment solution comprising a polymer derived from vinyl phosphonic acid and an aluminum (+3) salt and the salt and polymer concentrations are critically maintained within certain target amounts so that a certain number of phosphonic acid groups are deposited onto the anodic oxide layer of the substrate. This treatment is particularly useful when development is carried out using relatively low pH developers (for example, pH below 11.5).

EP 1,000,768A (Chau et al.) describes post-treatment of anodized aluminum supports using PVA/AA while applying a constant voltage or current to the post-treatment solution.

However, such post-treatment polymers are likely to attack the aluminum oxide layer on the substrate.

U.S. Pat. No. 6,114,089 (Takita et al.) describes positive-working lithographic printing plate precursors that are considered to have improved stain resistance and press life, which improvements are believed to be provided by a polymer having both acidic and alkaline groups. The imaged precursors can be developed using silicate-free developers.

U.S. Pat. No. 5,368,974 (Walls et al.) describes post-treatment of aluminum supports using a copolymer derived from VPA and an acrylamide. However, such post-treatment polymers are likely to attack the aluminum oxide layer on the substrate.

A two-step treatment using a silicate treatment followed by a PVPA treatment is described in EP 1,974,912 (Andriessen et al.).

Post-treatment of aluminum substrates PVPA in combination with hydrogen fluoride ("HF") to provide hydrophilic coatings is described in WO 93/15156 (Tost et al.).

The use of PVPA/HF post-treatments can cause problems during manufacturing, such as unplanned downtime to replace the post-treatment solution that is contaminated with undesired crystals. Such crystals can also clog the plumbing in the post-treatment system and require even more expensive cleaning using nitric acid. When the post-treatment solution is sprayed onto the substrate, crystal formation is avoided but several passes of the aluminum web may be needed in the spraying chamber to sufficiently cover the aluminum oxide layer and various apparatus modifications are needed to achieve uniform and complete coverage.

Despite all of these attempts to protect the aluminum oxide layer on aluminum-containing supports, there is need for further improvements in post-treatment solutions and methods so that background staining and corrosion of the aluminum oxide layer are reduced, while obtaining manufacturing efficiencies.

SUMMARY OF THE INVENTION

The present invention provides an electrochemically grained, anodized aluminum substrate comprising a post-treatment coating that has been applied after electrochemical graining and anodization, the post-treatment coating comprising a polymer derived at least in part from vinyl phosphonic acid, and the post-treatment coating having been applied from a coating solution comprising the polymer and phosphoric acid.

This invention also provides a lithographic printing plate precursor comprising a substrate having thereon one or more imageable layers, each imageable layer comprising a polymeric binder, and the precursor further comprising an infrared radiation absorber, the substrate being an electrochemically grained, anodized aluminum substrate having a post-treatment coating that has been applied after electrochemical graining and anodization, the post-treatment coating comprising a polymer derived at least in part from vinyl phosphonic acid, and the post-treatment coating having been applied from a post-treatment coating solution comprising the polymer and phosphoric acid.

Some of these lithographic printing plate precursors are positive-working and have a single imageable layer comprising a polymeric binder and an infrared radiation absorber, or they comprise:

an inner layer disposed over the substrate, the inner layer comprising a first polymeric binder, and an outer layer disposed over the inner layer, the outer layer comprising a second polymeric binder, wherein the infrared radiation absorber is generally present only in the inner layer.

Also, a method for providing a lithographic printing plate comprises:

imagewise exposing a lithographic printing plate precursor of this invention comprising a substrate having thereon one or more imageable layers, each imageable layer comprising a polymeric binder, and the precursor further comprising an infrared radiation absorber, the substrate being an electrochemically grained, anodized aluminum substrate having a post-treatment coating that has been applied after electrochemical graining and anodization, the post-treatment coating comprising a polymer derived at least in part from vinyl phosphonic acid, and the post-treatment coating having been applied from a post-treatment coating solution comprising the polymer and phosphoric acid, to provide exposed and non-exposed regions in the one or more imageable layers in an exposed precursor, and processing the exposed precursor to remove either the exposed or non-exposed regions.

The positive-working lithographic printing plates obtained from the method of this invention comprise an electrochemically grained, anodized aluminum substrate of this invention, and an imageable layer disposed over the substrate, the imageable layer comprising non-exposed regions comprising a polymeric binder and an infrared radiation absorber (since the exposed regions have been removed during processing).

In addition, this invention provides a method for preparing a substrate useful for lithographic printing plates, the method comprising:

applying a post-treatment coating solution to an electrochemically grained, anodized aluminum substrate to provide a post-treatment coating, the post-treatment coating solution comprising a polymer derived at least in part from vinyl phosphonic acid, and phosphoric acid.

Lithographic printing plate precursors can be obtained from this method, which the precursors comprise the post-treated, electrochemically grained, anodized aluminum substrate of this invention.

The present invention provides an alternative to post-treatment using PVPA/HF solutions for making lithographic printing plate precursors, particularly positive-working lithographic printing plate precursors that are imageable and then developable using silicate-free developers that are more environmentally desirable and that can be used at lower replenishment rates with greater processing latitude. It has also been found that the present invention can provide lithographic printing plates that exhibit reduced background stain even at shortened dwell times (post-treatment times), reduced corrosion of aluminum oxide, and improved manufacturing latitude (even a few seconds improvement provides more consistent manufacturing methods). These advantages are provided by post-treatment of an electrochemically grained and anodized aluminum support with a coating solution (post-treatment solution) comprising a polymer derived at least in part from vinyl phosphoric acid, and phosphoric acid. This post-treatment can be carried out using various methods including spraying, immersing, or other coating techniques.

DETAILED DESCRIPTION OF THE INVENTION

Definitions

Unless the context indicates otherwise, when used herein, the terms "substrate", "lithographic printing plate precursor", "positive-working lithographic printing plate precursor", "negative-working lithographic printing plate precursors", and "lithographic printing plate" are meant to be references to embodiments of the present invention.

The term "support" is used herein to refer to an aluminum-containing material (web, sheet, foil, or other form) that is then post-treated to prepare a "substrate" that refers to the hydrophilic article to which various imageable layers are applied. Thus, a "support" is used to prepare a "substrate" article of this invention.

The term "post-treatment coating solution" refers to the aqueous solution used to provide a post-treatment layer on the electrochemically grained, anodized aluminum support (for example, a moving electrochemically grained, anodized aluminum web or sheet).

In addition, unless the context indicates otherwise, the various components described herein such as the components of the various layers in the lithographic printing plate precursor or of the post-treatment coating solutions used in the method of this invention, refer to one or more of those components. Thus, the use of the article "a" or "an" is not necessarily meant to refer to only a single component.

Unless otherwise indicated, percentages refer to percents by dry weight of a dry layer or % solids or a coating formulation or post-treatment or processing solution.

As used herein, the term "radiation absorber" refers to compounds that are sensitive to certain wavelengths of radiation and can convert photons into heat within the layer in which they are disposed. These compounds may also be known as "photothermal conversion materials", "sensitizers", or "light to heat convertors".

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers. The term "copolymer" refers to polymers that are derived from two or more different monomers and the recurring units are arranged, unless otherwise indicated, in random order. That is, they comprise recurring units having from about two different chemical structures, generally in random order.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The post-treated substrates of this invention can be used to prepare various imageable elements including the lithographic printing plate precursors of this invention. However, this is not meant to be the only use of the substrates of this invention. For example, the substrates can be used for any application requiring hydrophilic aluminum-containing surfaces including thermal patterning systems, masking elements, and printed circuit boards. A skilled artisan would know how to use the substrates of this invention for these other applications.

Substrate

The substrates prepared according to this invention are generally provided initially as an electrochemically grained, anodized support having aluminum as the predominant component, and including supports of pure aluminum and aluminum alloys. Thus, the electrochemically grained, anodized metal support can be composed of pure aluminum, aluminum alloys having small amounts (up to 10% by weight) of other elements such as manganese, silicon, iron, titanium, copper, magnesium, chromium, zinc, bismuth, nickel, or zirconium, or be polymeric films or papers on which a pure aluminum or aluminum alloy sheet is laminated or deposited (for example, a laminate of an aluminum sheet and a polyester film). Generally, electrochemically grained pure aluminum or aluminum alloys are used in the practice of this invention. The supports can be in any useful form or shape including continuous webs, sheets, and coils.

The thickness of the resulting electrochemically grained, anodized, and post-treated substrate can be varied but should be sufficient to sustain the wear from printing and thin enough to wrap around a printing form. Generally, support sheets used to make the substrates have a thickness of at least 100 and up to and including 600 μm.

In general, the supports used to prepare substrates have the desired tensile strength, elasticity, crystallinity, conductivity, and other physical properties that are conventional in the lithographic art, which properties can be achieved using known treatments such as heat treatment, cold or hot fabrication processes, or other methods conventional in the art of aluminum alloy fabrication for lithographic substrate preparation. The substrates can be prepared as continuous webs or coiled strips that can be cut into desired sheets at a later time.

The aluminum surface of the support is generally cleaned, roughened, and anodized using suitable known procedures before the post-treatment solution is applied according to this invention. For example, a degreasing treatment with a surfactant, an organic solvent, or an alkaline water solution is typically used to remove oil and grease from the surface of the support. Then, the surface may be roughened (or grained) by well known techniques, such as mechanical roughening, electrochemical roughening, or a combination thereof (multi-graining). Electrochemically graining can be carried out in a suitable manner as described for example in U.S. Pat. No. 7,049,048 (noted above) that is incorporated herein by reference.

In some embodiments, the surface of the aluminum-containing support can be electrochemically grained using the procedure and chemistry described in U.S. Patent Application Publication 2008/0003411 (Hunter et al.) that is also incorporated herein. In these procedures, the roughened aluminum-containing support is subjected to alternating current in an electrolytic solution containing a suitable strong acid such as hydrochloric, nitric acid, or mixtures thereof. The acidic concentration of the electrolytic solution is generally at least 0.4% and typically at least 0.7% and up to and including 2% for hydrochloric acid, or at least 0.2% and typically at least 0.4% and up to and including 2.5% for nitric acid. Optional additives can be present in the electrolytic solution as corrosion inhibitors or stabilizers including but not limited to, metal nitrates and chlorides (such as aluminum nitrate and aluminum chloride), monoamines, diamines, aldehydes, phosphoric acid, chromic acid, boric acid, lactic acid, acetic acid, and oxalic acid.

This electrochemically grained metal sheet is generally etched with an alkaline solution to remove at least 100 mg/m$^2$, and typically to remove at least 100 mg/m$^2$ and up to and including 1000 mg/m$^2$. Etching can be carried out by immersing the metal sheet in a highly acidic solution or a highly alkaline solution having a pH of at least 13 and conductivity of at least 30 mS/cm and up to and including 90 mS/cm. It is important to remove sufficient aluminum metal in order to change its optical density, which is directly related to the "smut" level on the surface of the aluminum sheet. The amount of aluminum metal removed is a function of concentration, temperature, and dwell time in the etching process. Thus, there are many combinations of these parameters that a skilled artisan can consider in routine experimentation to find the optimum etching conditions.

The electrochemically grained aluminum support can then be anodized in a sulfuric acid solution (5-30%) at a temperature of at least 20° C. and up to and including 60° C. for at least 5 and up to and including 250 seconds to form an oxide layer on the metal surface. When phosphoric acid is used for anodization, the conditions can be varied, as one skilled in the art would readily know. Generally, anodization is carried out to provide an oxide layer of at least 0.3 $g/m^2$ and typically at least 1.5 $g/m^2$ and up to and including 4 $g/m^2$.

The aluminum-containing support is then post-treated to provide the unique hydrophilic post-treatment layer to render its surface more hydrophilic. The post-treatment coating solution comprises a polymer derived at least in part from vinyl phosphonic acid. In most embodiments, at least 10 mol % of the total recurring units in the polymer is derived from the vinyl phosphonic acid. More likely, at least 20 mol % and up to 100 mol % of the total recurring units is derived from the vinyl phosphonic acid, or more typically at least 15 mol % and up to and including 60 mol % of the total recurring units is derived from the vinyl phosphonic acid.

Where the polymer comprises recurring units derived from other ethylenically unsaturated polymerizable monomers, such recurring units can be derived from one or more (meth) acrylates, (meth)acrylamides, (meth)acrylic acid, and vinyl phosphonic acid dimethylester. Methacrylic acid and acrylamide are particularly useful monomers. Combinations of these monomers can be used. For example, in some embodiments, the polymer can comprise at least 10 mol % and up to and including 60 mol % of recurring units derived from at least one (meth)acrylamide and at least 20 mol % and up to and including 80 mol % of recurring units derived from at least one of (meth)acrylic acid. Such polymers also include at least 10 mol % and up to and including 50 mol % of recurring units derived from vinyl phosphonic acid. The useful ethylenically unsaturated polymerizable monomers can be obtained from a number of commercial sources. Preparing the polymers is easily done using known free radical polymerization conditions.

The post-treatment coating solution comprises at least 0.005 weight % and up to and including 1 weight %, and typically at least 0.2 weight % and up to and including 0.5 weight %, of the noted polymer having recurring units derived at least from vinyl phosphonic acid. This post-treatment coating solution is also applied in such a manner (described below) so that the dried post-treatment coating is present in the substrate in an amount of at least 0.2 $mg/m^2$ and up to and including 50 $mg/m^2$, or typically in an amount of at least 5 $mg/m^2$ and up to and including 30 $mg/m^2$.

The post-treatment coating solution also comprises phosphoric acid in an amount of at least 0.01 weight %, or typically in an amount of at least 0.05 weight %, and up to and including 0.1 weight %.

The electrochemically grained, anodized aluminum support can be post-treated in various forms, but a continuous web of the support can be passed through the coating solution at a rate sufficient to provide the desired layer of polymer on its surface. For example, the electrochemically grained, anodized aluminum support can be immersed in the post-treatment coating solution for a suitable time to deposit the desired amount of polymer. The post-treated substrate can be dried in a suitable manner, with or without rinsing it with water to remove excess post-treatment coating solution including non-reacted polymer.

In other embodiments, post-treatment can be carried out using a "spray" mode in which the post-treatment coating solution is delivered or applied to the electrochemically grained, anodized aluminum support using one or more spray bars from a reservoir or recovery tank using a suitable fluid delivery system. The reservoir or recovery tank can contain an appropriate amount of post-treatment coating solution. After this spraying process, the excess post-treatment coating solution containing non-reacted polymer can be removed by rinsing with water.

Application of the post-treatment coating solution is generally carried out at a temperature of at least 20 and up to and including 80° C. (typically at least 40 and up to and including 70° C.) while contacting the electrochemically grained and anodized aluminum support (for example, web) for at least 1 and up to and including 60 seconds (typically for at least 5 and up to and including 20 seconds).

A replenishment post-treatment coating solution can be made up by dissolving the desired amount of polymer and phosphoric acid in water, and supplied as needed. While the replenishment post-treatment coating solutions are typically used in a continuous manner, but they can also be used intermittently, that is, as needed during the treatment of a support.

Once the coating solution has been appropriately applied and dried, at least one imageable layer formulation can be applied to the post-treatment layer. In some embodiments, this imageable layer formulation comprises a polymeric binder that becomes more soluble upon exposure to infrared radiation, to provide a positive-working lithographic printing plate precursor. If a negative-working lithographic printing plate precursor is being prepared, the imageable layer is designed with negative-working chemistry containing the desired chemical components and polymeric binders as described below.

In either instance, an infrared radiation absorber (described below) can also be incorporated into the lithographic printing plate precursor, and usually in it is incorporated into one or more imageable layers.

The backside (non-imaging side) of the substrate can be coated with antistatic agents, slipping layers, or a matte layer to improve handling and "feel" of the lithographic printing plate precursor and to provide useful stacking properties, with or without interleaf papers.

Positive-Working Lithographic Printing Plate Precursors

Many embodiments of the lithographic printing plate precursors of this invention are positive-working and include one or more imageable layers disposed on the substrate described above.

Some embodiments of such positive-working lithographic printing plate precursors comprise a single imageable layer while other embodiments are two-layer or multiple-layer precursors comprising at least an inner layer and an outer surface layer disposed over the inner layer.

The positive-working lithographic printing plate precursors of this invention are designed for imaging using infrared radiation and therefore contain one or more infrared radiation absorbers dispersed within one or more polymeric binders that, upon suitable irradiation, are soluble, dispersible, or removable in processing solutions including alkaline developers. Thus, the imageable layer(s), upon irradiation, undergoes a change in solubility properties with respect to the processing solution in its irradiated (exposed) regions.

Some representative "single-layer" positive-working lithographic printing plate precursors are described for example, in EP 1,543,046 (Timpe et al.), WO 2004/081662 (Memetea et al.), U.S. Pat. No. 6,255,033 (Levanon et al.), U.S. Pat. No. 6,280,899 (Hoare et al.), U.S. Pat. No. 6,391,524 (Yates et al.), U.S. Pat. No. 6,485,890 (Hoare et al.), U.S. Pat. No. 6,558,869 (Hearson et al.), U.S. Pat. No. 6,706,466 (Parsons et al.), U.S. Pat. No. 6,541,181 (Levanon et al.), U.S. Pat. No. 7,223,506 (Kitson et al.), U.S. Pat. No. 7,247,418 (Saraiya et al.), U.S. Pat. No. 7,270,930 (Hauck et al.), U.S. Pat. No. 7,279,263 (Goodin), and U.S. Pat. No. 7,399,576 (Levanon), EP 1,627,732 (Hatanaka et al.), and U.S. Published Patent Applications 2005/0214677 (Nagashima), 2004/0013965 (Memetea et al.), 2005/0003296 (Memetea et al.), and 2005/0214678 (Nagashima), all incorporated herein by reference.

If there is a single surface imageable layer in the lithographic printing plate precursor, this surface layer can contain one or more phenolic polymeric binders that are generally soluble in alkaline developers (defined below) after thermal imaging. In most embodiments of the lithographic printing plate precursors, these polymeric binders are present in an amount of at least 10 weight % and typically at least 20 and up to and including 95 weight % of the total dry imageable layer weight. By "phenolic", we mean a hydroxyl-substituted phenyl group.

Useful phenolic polymers include but are not limited to, poly(vinyl phenols) or derivatives thereof. They can also include pendant acidic groups such as carboxylic (carboxy), sulfonic (sulfo), phosphonic (phosphono), or phosphoric acid groups that are incorporated into the polymer molecule or pendant to the polymer backbone. Other useful additional phenolic polymers include but are not limited to, novolak resins, resole resins, poly(vinyl acetals) having pendant phenolic groups, and mixtures of any of these resins (such as mixtures of one or more novolak resins and one or more resole resins). Generally, such resins have a number average molecular weight of at least 3,000 and up to 200,000, and typically at least 6,000 and up to and including 100,000, as determined using conventional procedures. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or an m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful resins include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.), 2005/0051053 (Wisnudel et al.), and 2008/2008/0008956 (Levanon et al.). For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of at least 1,000 and up to and including 30,000. In addition, they can have a polydispersity less than 2. The branched poly(hydroxystyrenes) can be homopolymers or copolymers with non-branched hydroxystyrene recurring units.

Another group of useful polymeric binders are poly(vinyl phenol) and derivatives thereof. Such polymers are obtained generally by polymerization of vinyl phenol monomers, that is, substituted or unsubstituted vinyl phenols. Some vinyl phenol copolymers are described in EP 1,669,803A (Barclay et al.).

Additional polymeric binders that can be in the layer with the phenolic binder include phenolic resins such as novolak and resole resins that include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.).

The single-layer, positive-working lithographic printing plate precursors also include one or more radiation absorbers in the single imageable layer. Such compounds are sensitive to near-infrared or infrared radiation, for example of at least 700 nm and up to and including 1400 nm and typically at least 700 nm and up to and including 1200 nm.

Useful IR-sensitive radiation absorbers include carbon blacks and other IR-absorbing pigments and various IR-sensitive organic dyes ("IR dyes"). Examples of suitable IR dyes include but are not limited to, azo dyes, squarilium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al), U.S. Pat. No. 6,309,792 (Hauck et al.), and U.S. Pat. No. 6,787,281 (Tao et al.), and EP 1,182,033A2 (noted above). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanabe et al.). Suitable dyes can be formed using conventional methods and starting materials or obtained from various commercial sources including American Dye Source (Bale D'Urfe, Quebec, Canada) and FEW Chemicals (Germany). Other useful dyes for near infrared diode laser beams are described, for example, in U.S. Pat. No. 4,973,572 (DeBoer).

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Some useful IR cyanine dyes include a borate anion, such as a tetra-substituted borate anion, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

Useful infrared radiation absorbers can be obtained from a number of commercial sources or they can be prepared using known starting materials and procedures.

The infrared radiation absorber can be present in the precursor in an amount generally of at least 0.5 weight % and up to and including 30 weight % and typically at least 3 weight % and up to and including 20 weight %. The particular amount needed for this purpose would be readily apparent to one skilled in the art, depending upon the specific compound used to provide the desired chromophore.

In some embodiments, the IR radiation absorber is present in the single surface imageable layer. Alternatively or additionally, the IR radiation absorbers can be located in a separate layer that is in thermal contact with the single surface imageable layer. Thus, during imaging, the action of the IR radiation absorber can be transferred to the single surface imageable layer without the compound originally being incorporated into it.

In addition, solubility-suppressing components are optionally incorporated into the single imageable layer. Such components act as dissolution inhibitors that function as solubility-suppressing components for the polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetraalkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The single imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

A single-layer lithographic printing plate precursor can be prepared by applying the imageable layer formulation to the substrate described above using conventional coating or lamination methods. Thus, such formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable on-press printing cylinder or printing sleeve as the substrate.

The coating weight for the single imageable layer can be at least 0.5 $g/m^2$ and up to and including 2.5 $g/m^2$ and typically at least 1 $g/m^2$ and up to and including 2 $g/m^2$.

The selection of solvents used to coat the imageable layer formulation depends upon the nature of the polymeric materials and other components in the formulations. Generally, the formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art. The coated layer can be dried in a suitable manner.

Other positive-working lithographic printing plate precursors of this invention are multi-layer (generally two-layer) imageable elements that consist essentially of the substrate described above, an inner layer (also known in the art as an "underlayer"), and an outer layer (also known in the art as a "top layer" or "topcoat") disposed over the inner layer. Before thermal imaging, the outer layer is generally not soluble or removable by an alkaline developer within the usual time allotted for development, but after thermal imaging, the exposed regions of the outer layer are soluble in the alkaline developer. The inner layer is also generally removable by the alkaline developer. An infrared radiation absorber (described above) can also be present in such imageable elements, and is typically present in the inner layer only but it can optionally be in a separate layer between the inner and outer layers. Useful IR radiation absorbers are described above.

Thermally imageable, multi-layer lithographic printing plate precursors are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), U.S. Pat. No. 6,528,228 (Savariar-Hauck et al.), U.S. Pat. No. 7,163,770 (Saraiya et al.), U.S. Pat. No. 7,163,777 (Ray et al.), U.S. Pat. No. 7,186,482 (Kitson et al.), U.S. Pat. No. 7,223,506 (noted above), U.S. Pat. No. 7,229,744 (Patel), U.S. Pat. No. 7,241,556 (Saraiya et al.), U.S. Pat. No. 7,247,418 (noted above), U.S. Pat. No. 7,291,440 (Ray et al.), U.S. Pat. No. 7,300,726 (Patel et al.), and U.S. Pat. No. 7,338,745 (Ray et al.), U.S. Patent Application Publications 2004/0067432 A1 (Kitson et al.) and 2005/0037280 (Loccufier et al.), all of which are incorporated herein by reference.

These multi-layer lithographic printing plate precursors are formed by suitable application of an inner layer composition onto the substrate described above. Typically, it is disposed directly on the substrate. The inner layer comprises a first polymeric binder that is removable by a processing solution and typically soluble in that processing solution to reduce sludging. In addition, the first polymeric binder is usually insoluble in the solvent used to coat the outer surface layer so that the outer surface layer can be coated over the inner layer without dissolving the inner layer. Mixtures of these first polymeric binders can be used if desired in the inner layer. Such polymeric binders are generally present in the inner layer in an amount of at least 10 weight %, and generally at least 60 weight % and up to and including 95 weight % of the total dry inner layer weight.

Useful polymeric binders for the inner layer include (meth) acrylonitrile polymers, (meth)acrylic resins comprising carboxy groups, polyvinyl acetals, maleated wood rosins, styrene-maleic anhydride copolymers, (meth)acrylamide polymers including polymers derived from N-alkoxyalkyl methacrylamide, polymers derived from an N-substituted cyclic imide, polymers having pendant cyclic urea groups, and combinations thereof. Still other useful polymeric binders are derived from an N-substituted cyclic imide (especially N-phenylmaleimide), a (meth)acrylamide (especially methacrylamide), a monomer having a pendant cyclic urea group, and a (meth)acrylic acid (especially methacrylic acid). Polymeric binders of this type include copolymers that comprise at least 20 mol % and up to and including 75 mol % and typically at least 35 mol % and up to and including 60 mol % of recurring units derived from N-phenylmaleimide, N-cyclohexyl-maleimide, N-(4-carboxyphenyl)maleimide, N-benzylmaleimide, or a mixture thereof, at least 10 mol % and up to and including 50 mol % of recurring units derived from acrylamide, methacrylamide, or a mixture thereof, and at least 5 mol % and up to and including 30 mol % of recurring units derived from methacrylic acid. Other hydrophilic monomers, such as hydroxyethyl methacrylate, N-methoxymethyl(alkyl)acrylamides, and alkoxymethyl(alkyl)acrylates can be used in place of some or all of the methacrylamide. Other alkaline soluble monomers, such as acrylic acid, methacrylic acid, itaconic acid, and monomers having pendant 1H-tetrazole groups can be used in place of some or all of the methacrylic acid. Optionally, these polymers can also include recurring units derived from (meth)acrylonitrile or N-[2-(2-oxo-1-imidazolidinyl)ethyl]-methacrylamide.

Still other useful polymeric binders in the inner layer can comprise, in polymerized form, of at least 5 mol % and up to and including 30 mol % of recurring units derived from an ethylenically unsaturated polymerizable monomer having a carboxy group (such as acrylic acid, methacrylic acid, itaconic acid, and other similar monomers known in the art (acrylic acid and methacrylic acid are preferred), at least 20 mol % and up to and including 75 mol % of recurring units derived from N-phenylmaleimide, N-cyclohexylmaleimide, or a mixture thereof, optionally, at least 5 mol % and up to and including 50 mol % of recurring units derived from methacrylamide, and at least 3 mol % and up to and including 50 mol % one or more recurring units derived from monomer compounds of the following Structure:

$$CH_2{=}C(R_2){-}C({=}O){-}NH{-}CH_2{-}OR_1$$

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl, as described for example in U.S. Pat. No. 7,186,482 (Kitson et al.). Further details and methods of preparation of certain of these polymeric materials are disclosed in U.S. Pat. No. 6,475,692 (Jarek).

Additional useful polymeric binders for the inner layer are described for example, in U.S. Pat. No. 7,144,661 (Ray et al.), U.S. Pat. No. 7,163,777 (Ray et al.), and U.S. Pat. No. 7,223, 506 (Kitson et al.), and U.S. Patent Application Publications 2006/0257764 (Ray et al.) and 2007/0172747 (Ray et al.).

The polymeric binders can comprise at least 50% and up to and including 100% (dry weight) of the total polymeric materials in the inner layer. Still other useful polymeric materials include copolymers that comprises at least 1 and up to and including 30 mol % of recurring units derived from N-phenylmaleimide, at least 1 mol % and up to and including 30 mol % of recurring units derived from methacrylamide, at least 20 mol % and up to and including 75 mol % of recurring units derived from acrylonitrile, and at least 20 mol % and up to and including 75 mol % of recurring units derived from one or more monomers of the following Structure:

$$CH_2{=}C(R_{23}){-}CO_2{-}CH_2CH_2{-}NH{-}CO{-}NH\text{-}p\text{-}C_6H_4{-}R_{22}$$

wherein $R_{22}$ is OH, COOH, or $SO_2NH_2$, and $R_{23}$ is H or methyl, and, optionally, at least 1 mol % and up to and including 30 mol % and typically at least 3 mol % and up to and including 20 mol % of recurring units derived from one or more monomers of the following Structure:

$$CH_2{=}C(R_{25}){-}CO{-}NH\text{-}p\text{-}C_6H_4{-}R_{24}$$

wherein $R_{24}$ is OH, COOH, or $SO_2NH_2$, and $R_{25}$ is H or methyl.

Still other useful polymeric binders for the inner layer are polymers having pendant 1H-tetrazole groups as described for example in U.S. Patent Application Publication 2009-0142695 (Baumann et al.). Such polymeric binders can have recurring units providing a carbon-carbon backbone derived from one or more ethylenically unsaturated polymerizable monomers, and the 1H-tetrazole groups can be attached to the backbone through a linking group L comprising a $-C({=}O){-}NR^1{-}$, $-NR^1{-}(C{=}O){-}NR^2{-}$, $-S-$, $-OCO({=}O)-$, or $-CH{=}N-$ group, or a combination thereof. These polymers can also have recurring units derived, for example, from one or more other ethylenically unsaturated polymerizable monomers described in the noted publication.

The inner layer can also comprise one or more secondary polymeric materials that are resins having activated methylol and/or activated alkylated methylol groups, such as resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical). Useful secondary additional polymeric materials include copolymers that are disclosed in U.S. Pat. No. 6,294,311 (Shimazu et al.) and U.S. Pat. No. 6,528,228 (Savariar-Hauck et al.).

In most embodiments, the inner layer further comprises an infrared radiation absorber (as described above). In most embodiments, the infrared radiation absorber is present only in the inner layer. The infrared radiation absorber can be present in the multi-layer lithographic printing plate precursor in an amount of generally at least 0.5 weight % and up to and including 30 weight % and typically at least 3 weight % and up to and including 25 weight %. The particular amount of a given compound to be used could be readily determined by one skilled in the art.

The inner layer can include other components such as surfactants, dispersing aids, humectants, biocides, viscosity builders, drying agents, defoamers, preservatives, antioxidants, colorants, or organic or inorganic particles.

The inner layer generally has a dry coating coverage of at least 0.5 $g/m^2$ and up to and including 2.5 $g/m^2$ and typically at least 1 $g/m^2$ and up to and including 2 $g/m^2$. The total polymeric binders described above generally comprise at least 50 weight % and typically at least 60 weight % and up to and including 90 weight % based on the total dry layer weight, and this amount can be varied depending upon what other polymers and chemical components are present.

The outer layer of the imageable element is disposed over the inner layer and in most embodiments there are no intermediate layers between the inner and outer layers. The outer layer comprises a second polymeric binder that is usually different than the first polymeric binder described above for the inner layer. This second polymeric binder is a phenolic polymeric binder as described above for the single-layer lithographic printing plate precursor. In many embodiments, the outer layer is substantially free of infrared radiation absorbers, meaning that none of these compounds are purposely incorporated therein and insubstantial amounts diffuse into it from other layers. However, in other embodiments, the infrared radiation absorber can be in both the outer and inner layers, as described for example in EP 1,439,058A2 (Watanabe et al.) and EP 1,738,901A1 (Lingier et al.), or in an intermediate layer as described above.

The one or more second phenolic polymeric binders are present in the outer layer at a dry coverage of at least 15 weight % and up to and including 100 weight %.

The outer layer can also include colorants as described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element. The surface layer can optionally also include contrast dyes, printout dyes, coating surfactants, dispersing aids, humectants, biocides, viscosity builders, drying agents, defoamers, preservatives, and antioxidants.

The outer layer generally has a dry coating coverage of at least 0.2 $g/m^2$ and up to and including 2 $g/m^2$ and typically at least 0.3 $g/m^2$ and up to and including 1 $g/m^2$.

There can be a separate layer that is between and in contact with the inner and outer layers. This separate layer can act as a barrier to minimize migration of infrared radiation absorber(s) from the inner layer to the outer surface layer. This separate "barrier" layer generally comprises other polymeric binders that are soluble in the processing solution. If this polymeric binder is different from the first polymeric binder(s) in the inner layer, it is typically soluble in at least one organic solvent in which the inner layer first polymeric binders are insoluble. A useful polymeric binder for this purpose is a poly(vinyl alcohol). Generally, this barrier layer should be less than one-fifth as thick as the inner layer, and typically less than one-tenth as thick as the inner layer.

The multi-layer lithographic printing plate precursors can be prepared by sequentially applying an inner layer formulation over the surface of the hydrophilic substrate, and then applying an outer layer formulation over the inner layer using conventional coating or lamination methods. It is important to avoid intermixing of the inner and outer surface layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support.

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer surface layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer layers can be applied by extrusion coating methods from melt mixtures of the respective layer compositions. Typically, such melt mixtures contain no volatile organic solvents. Intermediate drying steps can be used between applications of the various layer formulations to remove solvent(s) before coating other formulations. Drying steps can also help in preventing the mixing of the various layers.

After drying the layers, the positive-working lithographic printing plate precursors can be further "conditioned" with a heat treatment of at least 40° C. and up to and including 90° C. for at least 4 hours (for example, at least 20 hours) under conditions that inhibit the removal of moisture from the dried layers. For example, the heat treatment is carried out at least 50° C. and up to and including 70° C. for at least 24 hours. During the heat treatment, the lithographic printing plate precursors are wrapped or encased in a water-impermeable sheet material to represent an effective barrier to moisture removal from the precursors, or the heat treatment of the precursors is carried out in an environment in which relative humidity is controlled to at least 25%. In addition, the water-impermeable sheet material can be sealed around the edges of the precursors, with the water-impermeable sheet material being a polymeric film or metal foil that is sealed around the edges of the precursors.

In some embodiments, this heat treatment can be carried out with a stack comprising at least 100 of the same lithographic printing plate precursors, or when the precursor is in the form of a coil or web. When conditioned in a stack, the individual precursors can be separated by suitable interleaving papers. The interleaving papers can be kept between the imageable elements after conditioning during packing, shipping, and use by the customer.

Negative-Working Lithographic Printing Plate Precursors

Some lithographic printing plate precursors of this invention are negative-working, and can be formed by suitable application of a radiation-sensitive composition as described below to a suitable substrate (described above) to form an imageable layer. There is generally only a single imageable layer comprising the radiation-sensitive composition and it can be the outermost layer in the element. For the on-press developable lithographic printing plate precursors, no oxygen barrier or topcoat is generally present in the lithographic printing plate precursors. However, such a topcoat can be present over the imageable layers designed for off-press development.

Negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Strehmel et al.), and U.S. Pat. No. 7,672,241 (Munnelly et al.), and U.S. Patent Application Publications 2003/0064318 (Huang et al.), 2004/0265736 (Aoshima et al.), 2005/0266349 (Van Damme et al.), and 2006/0019200 (Vermeersch et al.), all of which are incorporated herein by reference. Other negative-working compositions and elements are described for example in U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Patent Publication 2009/0092923 (Hayashi), all of which are incorporated herein by reference.

The radiation-sensitive compositions and imageable layers used in such precursors can generally include one or more particulate polymeric binders that are particulate non-reactive polyurethane-acrylic) hybrid. By "non-reactive", we mean that the particulate binders do not contain ethylenically unsaturated or other reactive or crosslinking groups. Such useful polymeric binders are particulate poly(urethane-acrylic) hybrids that are distributed (usually uniformly) throughout the imageable layer. Each of these hybrids has a molecular weight of at least 50,000 and up to and including 500,000 and the particles have an average particle size of at least 10 nm and up to and including 10,000 nm (typically at least 30 nm and up to and including 500 nm or at least 30 and up to and including 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly (urethane-acrylic) hybrid particles.

Polymeric binders are generally present in an amount of at least 5 weight % and up to and including 80 weight %, or typically at least 10 weight % and up to and including 30 weight %, based on the total solids of the radiation-sensitive composition or imageable layer.

The radiation-sensitive composition can include other polymeric binders that are homogenous, that is, non-particulate or dissolvable in the coating solvent, or they can exist as discrete particles. Such secondary polymeric binders are generally present in an amount of at least 5 weight % and up to and including 50 weight % based on total imageable layer solids. Useful polymeric binders include but are not limited to, (meth)acrylic acid and acid ester resins [such as (meth) acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.), all of which are incorporated herein by reference. Also useful are the vinyl carbazole polymers described in U.S. Pat. No. 7,175,949 (Tao et al.), and the polymers having pendant vinyl or ethylenically unsaturated polymerizable groups as described in U.S. Pat. No. 7,279,255 (Tao et al.), both patents being incorporated herein by reference. Useful random copolymers are derived from polyethylene glycol methacrylate, acrylonitrile, and styrene monomers in random fashion, dissolved random copolymers derived from carboxyphenyl methacrylamide, acrylonitrile, methacrylamide, and N-phenyl maleimide, random copolymers derived from polyethylene glycol methacrylate, acrylonitrile, vinyl carbazole, styrene, and methacrylic acid, random copolymers derived from N-phenyl maleimide, methacrylamide, and methacrylic acid, random copolymers derived from urethane-acrylic intermediate A (the reaction product of p-toluene sulfonyl isocyanate and hydroxylethyl methacrylate), acrylonitrile, and N-phenyl maleimide, and random copolymers derived from N-methoxymethyl methacrylamide, methacrylic acid, acrylonitrile, and n-phenylmaleimide. By "random" copolymers, we mean the conventional use of the term, that is, the structural units in the polymer backbone that are derived from the monomers are arranged in random order as opposed to being block copolymers, although two or more of the same structural units can be in a chain incidentally.

Other useful particulate and non-particulate polymeric binders for the imageable layer are included in the following non-exhaustive list:

I. Polymers formed by random polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth) acrylic acids, (meth)acrylate esters, styrene and its derivatives, vinyl carbazoles, and poly(alkylene oxide)(meth)acrylates in random fashion.

II. Polymers having pendant allyl ester groups as described in U.S. Pat. No. 7,332,253 (Tao et al.) that is incorporated herein by reference. Such polymers can also include pendant cyano groups or have recurring units derived from a variety of other monomers as described in Col. 8, line 31 to Col. 10, line 3 of the noted patent.

III. Polymers having all carbon backbones wherein at least 40 mol % and up to 100 mol % (and typically at least 40 mol % and up to and including 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached). Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone.

IV. Polymeric binders that have one or more pendant ethylenically unsaturated polymerizable groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182, 033A1 (Fujimaki et al.) and U.S. Pat. No. 4,874,686 (Urabe et al.), U.S. Pat. No. 7,729,255 (Tao et al.), U.S. Pat. No. 6,916, 595 (Fujimaki et al.), and U.S. Pat. No. 7,041,416 (Wakata et al.) that are incorporated by reference, especially with respect to the general formulae (1) through (3) noted in EP 1,182, 033A1.

V. Polymeric binders can have pendant 1H-tetrazole groups as described in U.S. Patent Application Publication 2009-0142695 (Baumann et al.) that is incorporated herein by reference.

The radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable compounds include those derived from urea urethane(meth)acrylates or urethane(meth) acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182, 033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Application Publication 2009/0142695 (Baumann et al.), which radically polymerizable components include 1H-tetrazole groups.

In addition to, or in place of the free radically polymerizable components described above, the radiation-sensitive composition can include polymeric materials that include side chains attached to the backbone, which side chains include one or more free radically polymerizable groups (such as ethylenically unsaturated groups) that can be polymerized (crosslinked) in response to free radicals produced by the initiator composition (described below). There can be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

This radiation-sensitive composition also includes an initiator composition that includes one or more initiators that are capable of generating free radicals sufficient to initiate polymerization of all the various free radically polymerizable components upon exposure of the composition to imaging infrared radiation. The initiator composition is responsive, for example, to electromagnetic radiation in the infrared spectral regions, corresponding to the broad spectral range of at least 700 nm and up to and including 1400 nm, and typically radiation of at least 700 nm and up to and including 1250 nm.

More typically, the initiator composition includes one or more an electron acceptors and one or more co-initiators that are capable of donating electrons, hydrogen atoms, or a hydrocarbon radical.

In general, suitable initiator compositions for IR-radiation sensitive compositions comprise initiators that include but are not limited to, aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators"

described in U.S. Pat. No. 5,629,354 of West et al.), oxime ethers and oxime esters (such as those derived from benzoin), α-hydroxy or α-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Useful initiator compositions for IR radiation sensitive compositions include onium compounds including ammonium, sulfonium, iodonium, and phosphonium compounds. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion.

Thus, the iodonium cations can be supplied as part of one or more iodonium salts, and the iodonium cations can be supplied as iodonium borates also containing suitable boron-containing anions. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference.

Useful IR radiation-sensitive initiator compositions can comprise one or more diaryliodonium borate compounds. Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis(4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The imageable layers comprise a radiation-sensitive imaging composition that includes one or more infrared radiation absorbers (described above). The total amount of one or more infrared radiation absorbers is at least 2 weight % and up to and including 30 weight %, or typically at least 5 weight % and up to and including 20 weight %.

The imageable layer can also include a poly(alkylene glycol) or an ether or ester thereof that has a molecular weight of at least 200 and up to and including 4000. Useful compounds of this type include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate.

The imageable layer can further include a poly(vinyl alcohol), a poly(vinyl pyrrolidone), poly(vinyl imidazole), or polyester in an amount of up to and including 20 weight % based on the total dry imageable layer weight.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Imo et al.). The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts.

The radiation-sensitive composition and imageable layer optionally includes a phosphate(meth)acrylate having a molecular weight generally greater than 250 as described in U.S. Pat. No. 7,429,445 (Munnelly et al.) that is incorporated herein by reference. By "phosphate(meth)acrylate" we also mean "phosphate methacrylates" and other derivatives having substituents on the vinyl group in the acrylate moiety.

The IR radiation-sensitive composition can be applied to the substrate of this invention as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying it onto a suitable support (such as an on-press printing cylinder). Typically, the radiation-sensitive composition is applied and dried to form an imageable layer.

In some embodiments, the outermost layer can be a water-soluble or water-dispersible overcoat (also sometimes known as an "oxygen impermeable topcoat" or "oxygen barrier layer") disposed over the imageable layer. Such overcoat layers can comprise one or more water-soluble poly(vinyl alcohols having a saponification degree of at least 90% and generally have a dry coating weight of at least 0.1 $g/m^2$ and up to and including 2 $g/m^2$ in which the water-soluble poly(vinyl alcohols comprise at least 60 weight % and up to and including 99 weight %. Some overcoats have a dry coverage of 0.5 $g/m^2$ or less. The overcoat can further comprise a second water-soluble polymer that is not a poly(vinyl alcohol) in an amount of from about 2 weight % to about 38 weight %, and such second water-soluble polymer can be a poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, and vinyl imidazole, and vinyl acetamide.

Alternatively, the overcoat can be formed predominantly using one or more of polymeric binders such as poly(vinyl pyrrolidone), poly(ethyleneimine), poly(vinyl imidazole), and random copolymers from two or more of vinyl pyrrolidone, ethyleneimine and vinyl imidazole, and mixtures of such polymers. The formulations can also include cationic, anionic, and non-ionic wetting agents or surfactants, flow improvers or thickeners, antifoamants, colorants, particles such as aluminum oxide and silicon dioxide, and biocides. Details about such addenda are provided in WO 99/06890 (Pappas et al.) that is incorporated by reference.

Illustrative of such manufacturing methods is mixing the various components needed for a specific imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described for the Invention Examples below. After proper drying, the coating weight of the imageable layer generally is at least 0.1 g/m$^2$ and up to and including 5 g/m$^2$ or typically at least 0.5 g/m$^2$ and up to and including 3.5 g/m$^2$.

Once the various layers have been applied and dried on the substrate, the negative-working imageable elements can be enclosed in water-impermeable material that substantially inhibits the transfer of moisture to and from the element and "heat conditioned" as described in U.S. Pat. No. 7,175,969 (Ray et al.) that is incorporated herein by reference. The lithographic printing plate precursors can be stored and transported as stacks of precursors within suitable packaging and containers known in the art.

Imaging Conditions

The lithographic printing plate precursors can have any useful form and size or shape including but not limited to, printing plates, printing cylinders, printing sleeves (both hollow or solid), and printing tapes (including flexible printing webs).

During use, the lithographic printing plate precursors are exposed to a suitable source of imaging or exposing radiation at a wavelength of from about at a wavelength of at least 750 nm and up to and including about 1400 nm and typically at least 700 nm and up to and including 1200 nm using an appropriate laser or array of lasers. Imaging can be carried out using IR imaging radiation at multiple wavelengths at the same time if desired.

The laser used to expose the imageable precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can function solely as a platesetter or it can be incorporated directly into a lithographic printing press. In the latter case, printing can commence immediately after imaging and development, thereby reducing press set-up time considerably. The imaging apparatus can be configured as a flatbed recorder or as a drum recorder, with the imageable precursor mounted to the interior or exterior cylindrical surface of the drum. An example of an useful near-infrared and infrared imaging apparatus is available as models of Creo Trendsetter or Creo Quantum 800 imagesetters available from Eastman Kodak Company (Burnaby, British Columbia, Canada) that contain laser diodes that emit near infrared radiation at a wavelength of about 830 nm. Other suitable imaging sources include the Crescent 42T platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of infrared radiation include direct imaging presses that can be used to image a precursor while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 mJ/cm$^2$ and up to and including 300 mJ/cm$^2$ depending upon the sensitivity of the lithographic printing plate precursor.

Development and Printing

After imaging, the imaged precursors can be processed "off-press" using a suitable processing solution described herein. Such processing is carried out for a time sufficient to remove predominantly only the non-exposed regions of the imaged imageable layer (for negative-working precursors) or exposed regions (for positive-working precursors) to reveal the hydrophilic surface of the substrate of this invention. The term "soluble" also means "dispersible".

Development or processing can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a suitable developer (described below), and followed by rinsing with water. "Dip" development involves dipping the imaged precursor in a tank or tray containing the appropriate developer for at least 10 and up to and including 60 seconds (especially at least 20 and up to and including 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged precursor is contacted with the developer in an appropriate manner. The apparatus may also include a suitable rubbing mechanism (for example a brush or roller) and a suitable number of conveyance rollers. Some developing apparatus include laser exposure means and the apparatus is divided into an imaging section and a developing section.

Developers or processing solutions commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally greater than 7 and up to 14. Both aqueous alkaline developers and organic solvent-containing developers can be used.

Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates), and can be diluted with water prior to use if desired.

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-containing developers can be neutral, alkaline, or slightly acidic in pH, and generally, they are alkaline in pH.

Representative solvent-based developers include ND-1 Developer, Developer 980, Developer 1080, 2 in 1 Developer, 955 Developer, D29 Developer (described below), and 956 Developer (all available from Eastman Kodak Company). These developers can be diluted with water if desired.

In some instances, a single processing solution is used to both develop the imaged precursor by removing predominantly the non-exposed regions and also to provide a protective layer or coating over the entire imaged and developed outer surface. In this aspect, the processing solution can behave somewhat like a gum that is capable of protecting the lithographic image on the printing plate against contamination or damage (for example, from oxidation, fingerprints, dust, or scratches). Such processing solutions generally have a pH greater than 2 and up to about 11, and typically from about 6 to about 11, or from about 6 to about 10.5, as adjusted using a suitable amount of an acid or base. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include salts of fatty acids, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition. The one or more anionic surfactants can be generally present in an amount of at least 1 weight %, and typically from at least 5 weight % or at least 8 weight % and up to and including 45 weight %, or up to and including 30 weight %. In some embodiments, the one or more anionic surfactants can be present in an amount of at least 8 and up to and including 20 weight %.

Some useful processing solutions are silicate-free and have a pH of at least 11 as described for example in copending and commonly assigned U.S. Ser. Nos. 12/948,808, 12/948,812, and 12/948,814 all filed Nov. 18, 2010 by Levanon et al.), all of which are incorporated herein by reference. In some of these embodiments, the silicate-free developers comprise a hydroxide, a metal cation (such as calcium ion), a chelating agent for the metal ion, and an alkali metal salt. In other embodiments, the silicate-free developers comprise a metal cation such as calcium or strontium cation and a metal ion chelating agent such as a phosphono-polycarboxylic acid. In still other embodiments, the silicate-free developer has a pH of at least 12 and comprises a metal cation such as barium, calcium, strontium, or zinc cation.

The processing solution (or developer) can be applied to the imaged precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator containing the gum. For example, the imaged precursor can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.).

The processing solution can also be applied in a processing unit (or station) in a suitable apparatus that has at least one roller for rubbing or brushing the imaged precursor while the processing solution is applied. Residual processing solution may be removed (for example, using a squeegee or nip rollers) or left on the resulting printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Following off-press development, the resulting lithographic printing plate can be postbaked with or without blanket or floodwise exposure to UV or visible radiation. Alternatively, a blanket UV or visible radiation exposure can be carried out, without a postbake operation.

Printing can be carried out by applying a lithographic printing ink and fountain solution to the printing surface of the lithographic printing plate. The fountain solution is taken up by the hydrophilic surface of the substrate revealed by the imaging and processing steps, and the ink is taken up by the remaining regions of the imaged outermost layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material. The lithographic printing plates can be cleaned between impressions, if desired, using conventional cleaning means.

Some negative-working lithographic printing plate precursors are "on-press" developable particularly when the precursors contain a polymeric binder in the imageable layer in the form of discrete particles. The imaged precursor is directly mounted onto a printing press after imaging wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.). Such on-press development would be carried out after the coloring fluid is applied as described above.

The present invention provides at least the following embodiments and combinations thereof, but other combinations of features are considered to be within the present invention as a skilled artisan would appreciate from the teaching of this disclosure:

1. An electrochemically grained, anodized aluminum substrate comprising a post-treatment coating that has been applied after electrochemical graining and anodization, the post-treatment coating comprising a polymer derived at least in part from vinyl phosphonic acid, and the post-treatment coating having been applied from a post-treatment coating solution comprising the polymer and phosphoric acid.

2. The substrate of embodiment 1 wherein the post-treatment coating is present at a coverage of at least 0.2 $mg/m^2$ and up to and including 50 $mg/m^2$.

3. The substrate of embodiment 1 or 2 wherein the post-treatment coating comprises a polymer in which at least 10 mol % of the recurring units is derived from the vinyl phosphonic acid.

4. The substrate of any of embodiments 1 to 3 wherein the post-treatment coating comprises a polymer in which at least 15 mol % and up to and including 80 mol % of the recurring units is derived from the vinyl phosphonic acid.

5. The substrate of any of embodiments 1 to 4 wherein the post-treatment coating comprises a polymer comprising recurring units derived from one or more (meth)acrylates, (meth)acrylamides, (meth)acrylic acid, and vinyl phosphonic acid dimethylester.

6. The substrate of any of embodiments 1 to 5 wherein the post-treatment coating solution comprises phosphoric acid in an amount of at least 0.01 weight %.

7. The substrate of any of embodiments 1 to 6 wherein the post-treatment coating solution comprises phosphoric acid in an amount of at least 0.05 weight % and up to and including 0.1 weight %.

8. The substrate of any of embodiments 1 to 7 that is sulfuric acid-anodized.

9. A lithographic printing plate precursor comprising the substrate of any of embodiments 1 to 8 and having thereon one or more imageable layers comprising a polymeric binder, and the precursor further comprising an infrared radiation absorber.

10. The lithographic printing plate precursor of embodiment 9 comprising a single imageable layer comprising the polymeric binder and the infrared radiation absorber.

11. The lithographic printing plate precursor of embodiment 9 or 10 that is a positive-working lithographic printing plate precursor comprising at a single imageable layer comprising a polymeric binder that becomes more soluble after exposure to infrared radiation.

12. The lithographic printing plate precursor of embodiment 9 that is a positive-working lithographic printing plate precursor that comprises:

an inner layer disposed over the substrate, the inner layer comprising a first polymeric binder, and an outer layer disposed over the inner layer, the outer layer comprising a second polymeric binder, wherein the infrared radiation absorber is present only in the inner layer.

13. A method for providing a lithographic printing plate comprising:

imagewise exposing a lithographic printing plate precursor of any of embodiments 9 to 12 that comprises the substrate of any of embodiments 1 to 8 and having thereon one or more imageable layers, each imageable layer comprising a polymeric binder, and the precursor further comprising an infrared radiation absorber, to provide exposed and non-exposed regions in the one or more imageable layers in an exposed precursor, and processing the exposed precursor to remove either the exposed or non-exposed regions.

14. The method of embodiment 13 wherein processing is carried out using a silicate-free developer having a pH of at least 11.

15. The method of embodiment 13 or 14 wherein processing is carried out using a silicate-free developer comprising a hydroxide, carboxylic acid or both a carboxylic acid and phosphonic acid, and an anionic or nonionic surfactant.

16. A lithographic printing plate obtained from the method of any of embodiments 13 to 15.

17. A method for preparing the substrate of any of embodiments 1 to 9 that is useful for lithographic printing plates, the method comprising:

applying a post-treatment coating solution to an electrochemically grained, anodized aluminum support to provide a post-treatment coating, the post-treatment coating solution comprising a polymer derived at least in part from vinyl phosphonic acid, and phosphoric acid.

18. The method of embodiment 17 wherein the post-treatment coating solution comprises at least 0.05 weight % and up to and including 1 weight % of the polymer comprising recurring units derived at least in part from vinyl phosphonic acid.

19. The method of embodiment 17 or 18 wherein the post-treatment coating solution comprises at least 0.01 and up to and including 0.1 weight % of phosphoric acid.

20. The method of any of embodiments 17 to 19 wherein the post-treatment coating solution is applied by spraying it onto the electrochemically grained, anodized aluminum support, and rinsing to remove residual post-treatment coating solution containing non-reacted polymer.

21. The method of any of embodiments 17 to 19 wherein the post-treatment coating solution is applied by coating it onto the electrochemically grained, anodized aluminum support, and drying without a rinsing step.

22. The method of any of embodiments 17 to 21 further comprising applying at least one imageable layer formulation to the post-treatment coating on the electrochemically grain, anodized aluminum support, the at least one imageable layer formulation comprising a polymeric binder that becomes more soluble upon exposure to infrared radiation, to provide a positive-working lithographic printing plate precursor.

23. The method of any of embodiments 17 to 22 comprising further incorporating an infrared radiation absorber into the lithographic printing plate precursor.

24. A lithographic printing plate precursor that is obtained from the method of any of embodiments 17 to 23.

The following Examples are provided to illustrate the practice of this invention and are not meant to be limiting in any manner. The following materials were used in the Examples:

B18 is an alkali soluble binder polymer derived from poly (vinyl alcohol) that is acetalized with salicylaldehyde and butyraldehyde.

Bakelite® 9900 is a resole from cresol/phenol formaldehyde condensate that is available from Hexion (Ohio).

Polyfox® 652 is a fluorinated surfactant that is available from Omnova (Ohio).

Trump dye is an IR absorber that is available from Eastman Kodak Company.

Methyl Violet and Sudan Black are available from Aldrich Chemical Company.

MEK represents methyl ethyl ketone.

DEK represents diethyl ketone.

Dowanol® PM is propylene glycol methyl ether that was obtained from Dow Chemical Company.

Bayhibit® AM is a 50% solution of 2-phosphonobutane-1,24-tricarboxylic acid, that is available from Lanxess Deutschland GmbH.

Dowfax™ 2A1 is an alkyldiphenyl disulfonate surfactant that is available from Dow Chemical Company.

Hydromax® 300 is a cationic dissolution inhibitor that is available from Alfa-Chemicals (UK).

Am represents acrylamide.

VPA represents vinyl phosphonic acid.

MAA represents methacrylic acid.

DMABA represents dimethylaminobenzoic acid.

The polymers listed below in TABLE I were prepared using known polymerization techniques using AIBN as the polymerization initiator and ethanol as polymerization solvent. The monomer compositions of the polymers are given in weight %.

TABLE I

| | VPA | MAA | Am | Substrate |
|---|---|---|---|---|
| Polymer A | 27.0 | 73.0 | | 1 |
| Polymer B | 42.6 | 28.7 | 28.7 | 2 |
| Polymer C | 47.6 | 33.3 | 19.1 | 3 |
| Polymer D | 42.6 | 38.3 | 19.1 | 4 |
| Polymer E | 42.6 | 47.9 | 9.6 | 5 |
| Polymer F | 35.7 | 32.1 | 32.1 | 6 |
| Polymer G | 30.0 | 35.0 | 35.0 | 7 |
| Polymer H | 40.0 | 30.0 | 30.0 | 8 |
| Polymer I | 60.0 | | 40.0 | 9 |

The substrates used in the examples were as follows:

Substrate A was an electrochemically-grained and sulfuric acid-anodized aluminum support having an oxide weight of 2.7 $g/m^2$ and that had not been post-treated with PVPA/HF [poly(vinyl phosphonic acid)/hydrogen fluoride].

Substrate B was an electrochemically-grained and sulfuric acid-anodized aluminum support having with an oxide weight of 2.7 $g/m^2$ and that had been treated in a phosphate fluoride (PF) bath.

Substrates 1-9 were prepared by post-treating a sample of Substrate A with each post-treatment coating solution comprising the polymer described above in TABLE I and phosphoric acid at the range of amounts and temperatures described below in TABLE II. In some instances, no phosphoric acid was used in the post-treatment solution and the resulting substrates are not within the present invention.

An imageable layer formulation is made by dissolving (in parts by weight), DMABA (0.46), B-18 (4.3), Bakelite® 9900 (2.25), Trump Dye (0.19), Methyl Violet (0.15), Sudan Black (0.15), and Polyfox® PF652 (0.04) in MEK (18.49), DEK (27.74), and Dowanol® PM (46.23).

Silicate-free Developer A was prepared by dissolving (in parts by weight), potassium hydroxide (2.7), potassium citrate (1.75), Bayhibit® AM (0.5), calcium chloride dihydrate (0.04), Dowfax™ 2A1 (0.5), and Hydromax® 300 (0.09) in water (94.42).

Each post-treated substrate was then coated with the imageable layer formulation to provide a dried coating weight of about 1.5 $g/m^2$ to provide single-layer positive-working lithographic printing plate precursors. Each precursor was then imaged using a Kodak® Trendsetter imagesetter with test patterns at 100 $mJ/cm^2$ comprising solids and fine elements to evaluate the resolution and background stain. Each imaged precursor was then processed (developed) using Developer A through a Mercury processor at 1500 mm/min at 23° C.

The level of background staining was evaluated by placing a drop of acetone in the non-image regions and measuring the ΔE (the difference between the outside and the inside of an acetone ring). Background staining was rated by looking at both dwell times of 5 seconds and 10 seconds and ranked as strong when the ΔE>0.3, medium when ΔE was between 0.2-0.3, and as negligible when ΔE<0.2.

Corrosion or oxide attack (that is, attack of the aluminum oxide on the substrate) was measured as ΔOD (the difference in OD between undeveloped substrate, before coating, and after development inside the acetone ring). The oxide attack was ranked as strong when the ΔOD>0.04, medium when ΔOD was between 0.03-0.04, and as negligible when ΔOD<0.03.

In lithographic printing plates that showed strong staining, the oxide layer was protected from corrosion and therefore evaluation of the corrosion in these cases was not relevant and are marked in the tables as NA ("not applicable"). The results for each of the Invention substrates and lithographic printing plate precursors are given below in TABLE II.

Comparative Example 1

Substrate A was post-treated with PVPA under a range of temperatures, concentrations, and hydrogen fluoride (HF) concentrations at 5 and 10 seconds dwell times as shown in TABLE III. Without HF, all variations in PVPA concentration and temperature showed strong staining. Good results were obtained only in combination with HF, however only in a very narrow range. Any change in the HF concentration affected the result very strongly, leading to either staining or oxide attack. A concentration of exactly 30 mg/l of HF is difficult to maintain constant in a manufacturing situation.

Comparative Example 2

Substrate B was similarly coated, imaged, processed, and evaluated for staining and oxide attack. Both staining and oxide attack were found to be negligible.

The PF process allows aluminum substrates and lithographic printing plates to be obtained without staining and oxide attack, but it has a number of major disadvantages in the manufacturing process. Interlayer application using this process requires large treatment bath volumes and long dwell times. Another problem is the formation of toxic cryolith (aluminum trisodium hexafluoride) at unpredictable intervals, which can settle as sediments and hard deposits (crust) in the treatment tank, making cleaning operations very difficult, or leaving residue on the treated aluminum web, leading to coating and imaging defects. To avoid this problem, the treatment bath must be changed frequently.

The data shown in TABLE II below show that post-treating the substrates according to the present invention provides wide latitude in manufacturing of positive-working lithographic printing plate precursors that are compatible with silicate-free developers, to achieve minimal staining and oxide attack. These results match the results obtained with known precursors having substrates post-treated with the more difficult phosphate fluoride (PF).

However, when phosphoric acid was omitted from the post-treatment solution, strong staining resulted. The optimum post-treatment solutions used in this invention contained Polymer A, B, G, or H in concentrations of from 1 g/l to 2 g/l and phosphoric acid at 0.25 ml/l and were used at 75° C.

In contrast, as shown for Comparative Example 2, when the substrates were post-treated using the standard PVPA/HF solution and variations thereof, although easier to manufacture show insufficient manufacturing latitude. In other words, if the manufacturing conditions and solutions vary, the quality of post-treatment is not consistent.

TABLE II

| Post-treatment Polymer | Copolymer (g/l) / Temperature (° C.) / $H_3PO_4$ (ml/l) | 1 / 60 / 0 | 1 / 75 / 0 | 1 / 60 / 0.25 | 1 / 75 / 0.25 | 1 / 60 / 0.5 | 1 / 75 / 0.5 |
|---|---|---|---|---|---|---|---|
| 1 | Staining | Strong | Strong | Strong | Strong | Strong | Strong |
| 1 | Oxide attack | NA | NA | NA | NA | NA | NA |
| 2 | Staining | Strong | Strong | Negligible | Negligible | Negligible | Negligible |
| 2 | Oxide attack | NA | NA | Strong | Medium | Strong | Strong |
| 3 | Staining | Strong | Strong | Negligible | Negligible | Negligible | Negligible |
| 3 | Oxide attack | NA | NA | Strong | Strong | Medium | Strong |
| 4 | Staining | Strong | Strong | Negligible | Negligible | Negligible | Negligible |
| 4 | Oxide attack | NA | NA | Medium | Medium | Strong | Strong |
| 5 | Staining | Medium | Negligible | Negligible | Negligible | Negligible | Negligible |
| 5 | Oxide attack | Strong | Strong | Strong | Strong | Strong | Strong |
| 6 | Staining | Strong | Negligible | Negligible | Negligible | Negligible | Negligible |
| 6 | Oxide attack | NA | Strong | Strong | Strong | Strong | Strong |
| 7 | Staining | Strong | Strong | Negligible | Negligible | Negligible | Medium |
| 7 | Oxide attack | NA | NA | Medium | Negligible | Medium | Medium |
| 8 | Staining | Strong | Strong | Negligible | Negligible | Negligible | Negligible |
| 8 | Oxide attack | NA | NA | Strong | Medium | Strong | Strong |
| 9 | Staining | Strong | Strong | Strong | Medium | Negligible | Negligible |
| 9 | Oxide attack | NA | NA | NA | Medium | Medium | Strong |
| Post-treatment Polymer | Copolymer (g/l) / Temperature (° C.) / $H_3PO_4$ (ml/l) | 2 / 60 / 0 | 2 / 75 / 0 | 2 / 60 / 0.25 | 2 / 75 / 0.25 | 2 / 60 / 0.5 | 2 / 75 / 0.5 |
| 1 | Staining | Strong | Strong | Negligible | Negligible | Strong | Strong |
| 1 | Oxide attack | NA | NA | Negligible | Negligible | NA | NA |
| 2 | Staining | Strong | Strong | Negligible | Negligible | Medium | Medium |
| 2 | Oxide attack | NA | NA | Medium | Negligible | Negligible | Medium |
| 3 | Staining | Strong | Strong | Negligible | Negligible | Negligible | Strong |
| 3 | Oxide attack | NA | NA | Strong | Medium | Medium | Medium |
| 4 | Staining | Strong | Strong | Negligible | Negligible | Negligible | Negligible |
| 4 | Oxide attack | NA | NA | Strong | Strong | Strong | Strong |
| 5 | Staining | Medium | Negligible | Negligible | Negligible | Negligible | Negligible |
| 5 | Oxide attack | Strong | Strong | Strong | Medium | Strong | Not done |
| 6 | Staining | Strong | Strong | Medium | Negligible | Negligible | Medium |
| 6 | Oxide attack | NA | NA | Strong | Medium | Strong | Medium |
| 7 | Staining | Not done | Not done | Not done | Not done | Negligible | Medium |
| 7 | Oxide attack | Not done | Not done | Not done | Not done | Medium | Negligible |
| 8 | Staining | Strong | Strong | Negligible | Negligible | Negligible | Medium |
| 8 | Oxide attack | NA | NA | Medium | Negligible | Medium | Medium |
| 9 | Staining | Not done | Not done | Not done | Not done | Not done | Not done |
| 9 | Oxide attack | Not done | Not done | Not done | Not done | Not done | Not done |

TABLE III

| Comparative Example 2 | PVPA (g/l) / Temperature (° C.) / HF (mg/l) | 1 / 55 / 30 | 1 / 75 / 30 | 1 / 55 / 90 | 1 / 75 / 90 | 2 / 65 / 60 | 3 / 55 / 30 | 3 / 75 / 30 | 3 / 55 / 90 | 3 / 75 / 90 |
|---|---|---|---|---|---|---|---|---|---|---|
| PVPA/HF Substrate Treatment | Staining | Medium | Negligible | Negligible | Negligible | Strong | Strong | Medium | Strong | Strong |
| | Oxide attack | Negligible | Strong | Strong | Strong | NA | NA | Negligible | NA | NA |

The invention has been described in detail with particular reference to certain preferred embodiments thereof, but it will be understood that variations and modifications can be effected within the spirit and scope of the invention.

The invention claimed is:

1. A method for providing a lithographic printing plate comprising:

imagewise exposing a positive-working lithographic printing plate precursor to infrared radiation, the positive-working lithographic printing plate precursor comprising a substrate having thereon one or more imageable layers, each imageable layer comprising a polymeric binder, and the positive-working lithographic printing plate precursor further comprising an infrared radiation absorber, the substrate being an electrochemically grained, anodized aluminum substrate comprising an oxide layer from anodization, and a post-treatment coating that has been applied directly to the oxide layer using a post-treatment coating solution comprising a polymer derived at least in part from vinyl phosphonic acid, and phosphoric acid in an amount of at least 0.01 weight %, to provide an exposed positive-working lithographic printing plate precursor comprising exposed and non-exposed regions in the one or more imageable layers, and processing the exposed positive-working lithographic printing plate precursor with a silicate-free developer having a pH of at least 12, to remove the exposed regions from the one or more imageable layers.

2. The method of claim 1, wherein the silicate-free developer comprises a salt of a compound comprising both a carboxylic acid and a phosphonic acid.

3. The method of claim 1, wherein the post-treatment coating on the oxide layer of the substrate is present at a coverage of at least 0.2 $mg/m^2$ and up to and including 50 $mg/m^2$, and comprises a polymer in which at least 10 mol % of the recurring units is derived from the vinyl phosphonic acid.

4. The method of claim 1, wherein the post-treatment coating comprises a polymer in which at least 15 mol % and up to and including 100 mol % of the total recurring units are derived from the vinyl phosphonic acid, and the polymer also comprises recurring units derived from one or more (meth) acrylates, (meth)acrylamides, (meth)acrylic acid, and vinyl phosphonic acid dimethylester.

5. The method of claim 1, wherein the polymer in the post-treatment coating is a homopolymer derived from vinyl phosphonic acid.

6. The method of claim 1, wherein the positive-working lithographic printing plate precursor comprises a single imageable layer comprising the polymeric binder and the infrared radiation absorber.

7. The method of claim 1, wherein the positive-working lithographic printing plate precursor comprises:

an inner layer disposed over the post-treatment coating of the substrate, the inner layer comprising a first polymeric binder, and an outer layer disposed over the inner layer, the outer layer comprising a second polymeric binder.

8. The method of claim 1, wherein the silicate-free developer comprises one or more multivalent cations selected from the group consisting of barium cations, calcium cations, strontium cations, and zinc cations.

9. The method of claim 1, wherein the post-treatment coating solution comprises phosphoric acid in an amount of at least 0.05 weight %.

10. The method of claim 1, wherein the substrate has been sulfuric acid-anodized.

* * * * *